(12) United States Patent
Machida et al.

(10) Patent No.: US 10,790,556 B2
(45) Date of Patent: Sep. 29, 2020

(54) BATTERY SYSTEM

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Kiyohito Machida, Aichi-gun (JP); Yoshihiro Uchida, Nagakute (JP); Masaki Uchiyama, Obu (JP)

(73) Assignees: TOYOTA JIDOSHA KABUSHIKI KAISHA, Toyota-shi, Aichi-ken (JP); DENSO CORPORATION, Kariya-shi, Aichi-ken (JP)

( * ) Notice: Subject to any disclaimer, the term of this patent is extended or adjusted under 35 U.S.C. 154(b) by 82 days.

(21) Appl. No.: 16/245,834

(22) Filed: Jan. 11, 2019

(65) Prior Publication Data
US 2019/0221898 A1    Jul. 18, 2019

(30) Foreign Application Priority Data

Jan. 16, 2018  (JP) ................. 2018-004919

(51) Int. Cl.
| | | |
|---|---|---|
| H01M 10/42 | (2006.01) | |
| H01M 10/48 | (2006.01) | |
| H01M 10/613 | (2014.01) | |
| G01R 19/02 | (2006.01) | |
| G01R 31/3842 | (2019.01) | |
| H01M 10/6563 | (2014.01) | |

(52) U.S. Cl.
CPC .......... *H01M 10/486* (2013.01); *G01R 19/02* (2013.01); *G01R 31/3842* (2019.01); *H01M 10/425* (2013.01); *H01M 10/482* (2013.01); *H01M 10/613* (2015.04); *H01M 10/6563* (2015.04); *H01M 2010/4271* (2013.01); *H01M 2010/4278* (2013.01); *H01M 2220/20* (2013.01)

(58) Field of Classification Search
CPC ...................................................... H01M 10/48
See application file for complete search history.

(56) References Cited

U.S. PATENT DOCUMENTS

| | | | |
|---|---|---|---|
| 2013/0140886 A1* | 6/2013 | Bito | ..................... B60L 11/1864 307/10.7 |
| 2014/0300366 A1* | 10/2014 | Kobayakawa | .... H01M 10/4257 324/433 |
| 2014/0370940 A1* | 12/2014 | Yoshida | ................ H02J 7/0091 455/572 |

FOREIGN PATENT DOCUMENTS

JP     2006-138750 A     6/2006

\* cited by examiner

*Primary Examiner* — Haroon S. Sheikh
(74) *Attorney, Agent, or Firm* — Sughrue Mion, PLLC

(57) ABSTRACT

An ECU performs a process including the steps of: acquiring a lowest temperature TBmin and a temperature TC of cooling air; acquiring a fan airflow volume; setting a cooling coefficient; calculating a resistance value Rtmin; calculating a root-mean-square value of a current; setting TBoffset1; calculating a resistance value Rtmax; calculating a temperature index Ftmax; calculating a temperature index Ftmin; calculating an evaluation function ΔF; calculating a maximum current correction gain G; and calculating a maximum current value Imax.

3 Claims, 8 Drawing Sheets

FIG.6

|  |  | RAHR(%) | | | | | | |
| --- | --- | --- | --- | --- | --- | --- | --- | --- |
|  |  | 5 | 10 | 15 | 20 | ... | 80 | 90 |
| BATTERY TEMPERATURE (°C) | −30 | R11 | R12 | R13 | R14 | ... | R18 | R19 |
|  | −25 | R21 | R22 | R23 | R24 | ... | R28 | R29 |
|  | −20 | R31 | R32 | R33 | R34 | ... | R38 | R39 |
|  | −15 | R41 | R42 | R43 | R44 | ... | R48 | R49 |
|  | ... | ... | ... | ... | ... | ... | ... | ... |
|  | 50 | R81 | R82 | R83 | R84 | ... | R88 | R89 |
|  | 60 | R91 | R92 | R93 | R94 | ... | R98 | R99 |

|  |  | TBmin (°C) | | | | | | | |
|---|---|---|---|---|---|---|---|---|---|
|  |  | -30 | -25 | -20 | -15 | -10 | ... | 40 | 50 | 60 |
| ΔF | 0 | G1 | G1 | G1 | G1 | G1 | ... | G1 | G1 | G1 |
|  | 1 | G1 | G1 | G1 | G1 | G1 | ... | G1 | G1 | G1 |
|  | 2 | G2 | G2 | G2 | G2 | G2 | ... | G3 | G3 | G3 |
|  | ... | ... | ... | ... | ... | ... | ... | ... | ... | ... |
|  | 10 | G4 | G4 | G4 | G4 | G4 | ... | G5 | G5 | G5 |

BATTERY SYSTEM

This nonprovisional application is based on Japanese Patent Application No. 2018-004919 filed on Jan. 16, 2018 with the Japan Patent Office, the entire contents of which are hereby incorporated by reference.

BACKGROUND

Field

The present disclosure relates to battery systems, and more particularly to a battery system including a battery pack configured to include a plurality of secondary batteries connected in parallel.

Description of the Background Art

Japanese Patent Laying-Open No. 2006-138750 discloses a battery monitoring apparatus for monitoring the state of a secondary battery block (battery pack). The secondary battery block is formed of a plurality of parallel cell blocks connected in series. Each of the plurality of parallel cell blocks is formed of a plurality of cells (secondary batteries) connected in parallel.

In this battery monitoring apparatus, an amount of voltage change in each parallel cell block before and after energization is calculated, and an amount of current change in the secondary battery block before and after energization is calculated. Then, internal resistance of each parallel cell block is calculated from the amount of voltage change and the amount of current change calculated, to determine an abnormality of the cells based on the calculated internal resistance.

SUMMARY

In the battery monitoring apparatus described above, although an abnormality of the cells can be determined, no consideration is given to current variation caused by temperature variation that occurs between the cells of a parallel cell block. When temperature variation occurs between cells of a parallel cell block, resistance variation between the cells increases, resulting in increased current variation between the cells. As a result, even if battery protection control is performed based on a total current or an average current flowing in the parallel cell block, for example, it may not be possible to protect a cell in which a relatively large current flows in the parallel cell block.

An object of the present disclosure is to provide a battery system capable of implementing appropriate battery protection control in consideration of current variation caused by temperature variation between a plurality of secondary batteries connected in parallel.

A battery system according to one aspect of the present disclosure includes: a battery pack formed of a plurality of secondary batteries connected in parallel; a cooling device configured to supply a cooling medium to the battery pack; and a controller configured to estimate current variation between the plurality of secondary batteries caused by temperature variation between the plurality of secondary batteries. The plurality of secondary batteries include a first battery and a second battery. The controller is configured to calculate a first temperature index having correlation with a temperature of the first battery, using an amount of heat generated by the first battery, the first battery having a relatively low temperature of the plurality of secondary batteries, and a cooled amount of the first battery by the cooling device. The controller is configured to set a temperature additional value using information related to a heat generating state of the battery pack. The controller is configured to calculate a second temperature index having correlation with a temperature of the second battery, using an amount of heat generated by the second battery, the second battery having a temperature calculated by adding the temperature additional value to the temperature of the first battery, and a cooled amount of the second battery by the cooling device. The controller is configured to calculate an evaluation value indicating a degree of the temperature variation by subtracting the first temperature index from the second temperature index. The controller is configured to estimate a degree of the current variation using the calculated evaluation value and a temperature of the battery pack.

Accordingly, the second temperature index is calculated using the set temperature additional value, thereby allowing the evaluation value to be calculated with a high degree of accuracy. As a result, the current variation between the plurality of secondary batteries connected in parallel caused by the temperature variation between the plurality of secondary batteries can be estimated with a high degree of accuracy. Thus, appropriate battery protection control can be implemented on the plurality of secondary batteries.

In one embodiment, the information related to a heat generating state of the battery pack is information about a current in the battery pack. The controller is configured to set the temperature additional value to a higher value, when a root-mean-square value of the current is higher, than a value which is set when the root-mean-square value is lower.

Accordingly, the temperature additional value can be set appropriately in accordance with the heat generating state of the battery pack based on the root-mean-square value of the current.

In one embodiment, the first battery has the lowest temperature of the plurality of secondary batteries. The second battery has the highest temperature of the plurality of secondary batteries. The battery system further includes a detection device configured to detect the temperature of the first battery. The controller is configured to acquire the temperature of the first battery using the detection device, and to calculate the temperature of the second battery by adding the temperature additional value to the temperature of the first battery.

Accordingly, the evaluation value indicating the degree of the temperature variation can be calculated appropriately.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 6 is a map for determining a coefficient f used in an equation (1) and an equation (4).

DESCRIPTION OF THE PREFERRED EMBODIMENTS

Figure 1:
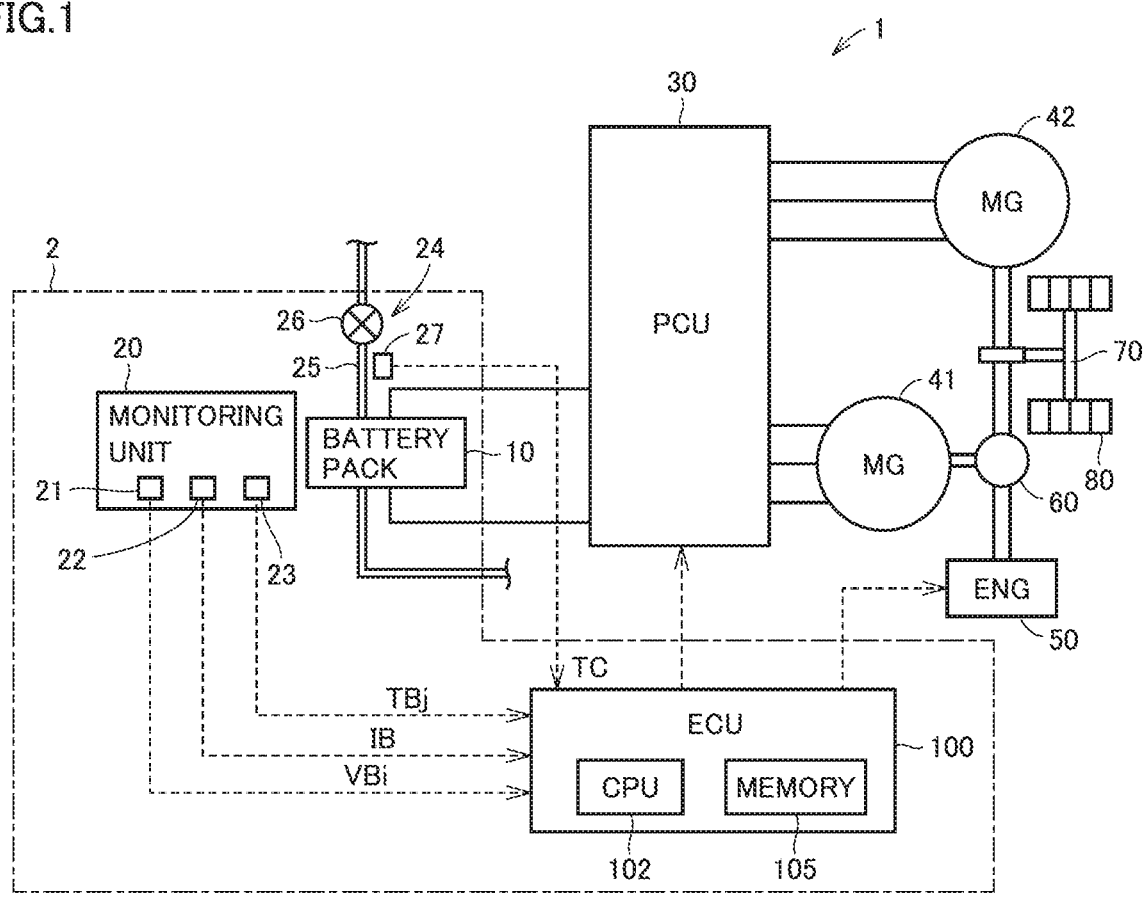
FIG. 1 schematically shows a configuration of a vehicle having mounted thereon a battery system according to an embodiment of the present disclosure.

An embodiment of the present disclosure will be described hereinafter in detail with reference to the drawings. It should be noted that the same or corresponding parts are designated by the same symbols in the drawings and will not be described repeatedly.

FIG. 1 schematically shows a configuration of a vehicle 1 having mounted thereon a battery system according to the embodiment of the present disclosure. In the following description, vehicle 1 is described as a hybrid vehicle as an example.

Referring to FIG. 1, vehicle 1 includes a battery system 2, a PCU (Power Control Unit) 30, MGs (Motor Generators) 41, 42, an engine 50, a power split device 60, a drive shaft 70, and a driving wheel 80.

Battery system 2 includes a battery pack 10, a monitoring unit 20, a cooling device 24, and an ECU (Electronic Control Unit) 100. Cooling device 24 is a device for supplying a cooling medium (cooling air in the present embodiment) to battery pack 10, and includes a duct 25, a fan 26, and a temperature sensor 27. The cooling medium may be coolant.

Engine 50 is an internal combustion engine such as a gasoline engine or a diesel engine, which converts combustion energy generated by combustion of an air-fuel mixture into kinetic energy of a movable member such as a piston or a rotor, to thereby output motive power. Power split device 60 includes, for example, a planetary gear mechanism having three rotation shafts of a sun gear, a carrier and a ring gear. Power split device 60 transmits motive power output from engine 50 to MG 41 and driving wheel 80.

MGs 41, 42 are each an AC rotating electrical machine, such as a three-phase AC synchronous motor having a permanent magnet embedded in a rotor. MG 41 is mainly used as a power generator driven by engine 50 through power split device 60. Electric power generated by MG 41 is supplied to at least one of MG 42 and battery pack 10 through PCU 30.

MG 42 mainly operates as a motor, and drives driving wheel 80 by receiving at least one of electric power from battery pack 10 and electric power generated by MG 41. Driving power from MG 42 is transmitted to drive shaft 70, and to driving wheel 80. During braking or suppression of acceleration on a downslope by vehicle 1, on the other hand, MG 42 operates as a power generator and regenerates electric power. Electric power generated by MG 42 is supplied to battery pack 10 through PCU 30.

Battery pack 10 is configured to include a plurality of cells connected in parallel (the detailed configuration of which will be described later). Each cell is a secondary battery such as a lithium ion secondary battery or a nickel-metal hydride secondary battery. Battery pack 10 stores electric power for driving MGs 41, 42. That is, battery pack 10 can supply electric power to MG 41 or MG 42 through PCU 30. Battery pack 10 can also be charged by receiving generated electric power through PCU 30 during power generation of MGs 41, 42.

Monitoring unit 20 includes a voltage detection device 21, a current detection device 22, and a temperature detection device 23. Voltage detection device 21 detects a voltage (hereinafter also referred to as "cell voltage") $VB_i$ of the plurality of cells connected in parallel in battery pack 10. Current detection device 22 detects a charge/discharge current IB in battery pack 10. Temperature detection device 23 detects temperatures TB1 to TBj of battery pack 10 using thermistors (1) to (j) provided at a plurality of locations in battery pack 10 and the like.

Duct 25 is a passage through which to supply the cooling air to battery pack 10. Duct 25 is provided with fan 26. Although fan 26 is provided on duct 25 at the air inlet side in this embodiment, fan 26 may be provided on duct 25 at the air outlet side. Fan 26 operates based on a control signal from ECU 100, for example. Temperature sensor 27 detects a temperature TC of the cooling air supplied to battery pack 10 through duct 25.

PCU 30 performs bidirectional power conversion between battery pack 10 and MG 41, or bidirectional power conversion between battery pack 10 and MG 42, based on a control signal from ECU 100. PCU 30 is configured to control the states of MGs 41, 42 independently of each other, and can bring MG 41 into a regenerating (power generating) state, while bringing MG 42 into a power running state, for example. PCU 30 is configured to include, for example, two inverters provided to correspond to MGs 41, 42, respectively, and a converter capable of boosting a DC voltage supplied to each inverter to a voltage equal to or higher than an output voltage from battery pack 10.

ECU 100 is configured to include a CPU (Central Processing Unit) 102, a memory (a ROM (Read Only Memory) and a RAM (Random Access Memory)) 105, and an input/output port (not shown) through which to input/output various signals. ECU 100 controls charge/discharge of battery pack 10 by controlling engine 50 and PCU 30 based on a signal received from each sensor or each detection device, and a program and a map stored in memory 105.

Figure 2:
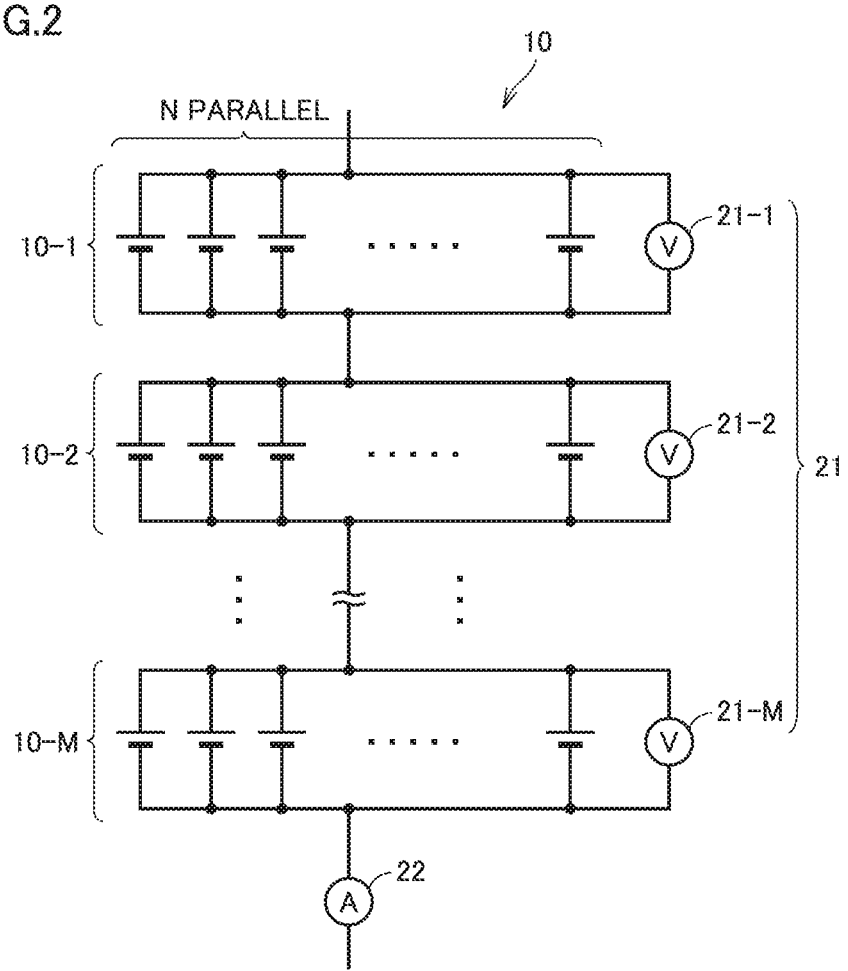
FIG. 2 shows an example of a detailed configuration of a battery pack shown in FIG. 1.

FIG. 2 shows an example of a detailed configuration of battery pack 10 shown in FIG. 1. Referring to FIG. 2, in this battery pack 10, a plurality of cells are connected in parallel to form a block (or a module), and a plurality of the blocks are connected in series to form battery pack 10. Specifically, battery pack 10 includes blocks 10-1 to 10-M connected in series, and each of blocks 10-1 to 10-M includes N cells connected in parallel.

Voltage detection device 21 includes voltage sensors 21-1 to 21-M. Voltage sensors 21-1 to 21-M detect voltages of blocks 10-1 to 10-M, respectively. That is, voltage sensor 21-1 detects a voltage VB1 of the N cells forming block 10-1. Similarly, voltage sensors 21-2 to 21-M detect voltages VB2 to VBM of the N cells forming blocks 10-2 to 10-M, respectively. Current detection device 22 detects a current IB flowing in each of blocks 10-1 to 10-M. That is, current detection device 22 detects a total current flowing in the N cells of each block.

In battery pack 10 configured to include the plurality of cells connected in parallel in this manner, temperature variation occurs between the plurality of cells connected in parallel (hereinafter referred to simply as "between the cells"). For example, there is variation in initial resistance (product variation) between the cells. Since a relatively large current flows in a cell having a relatively low resistance, the cell of lower initial resistance may have a relatively high temperature. The temperature variation also occurs depending on the arrangement of a cell (such as whether the cell is in the vicinity of the center or in the vicinity of an end within a case), or the cooling structure (such as the configuration of the cooling air passage) within the case.

Figure 3:
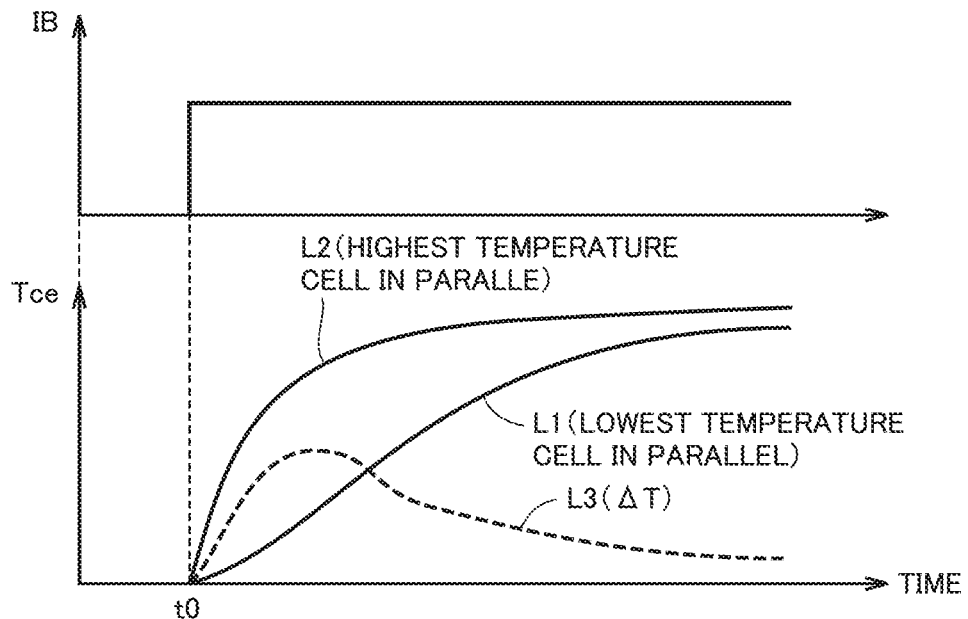
FIG. 3 shows an example of temperature variations in the highest temperature cell and the lowest temperature cell of a plurality of cells connected in parallel.

FIG. 3 shows an example of temperature variations in the highest temperature cell and the lowest temperature cell of the plurality of cells connected in parallel. The highest temperature cell indicates a cell having the highest temperature of the plurality of cells connected in parallel. The lowest temperature cell indicates a cell having the lowest temperature of the plurality of cells connected in parallel. Referring to FIG. 3, lines L1 and L2 indicate temperature variation in the lowest temperature cell and temperature variation in the highest temperature cell, respectively, and a line L3 indicates variation in a temperature difference ΔT between the highest temperature cell and the lowest temperature cell. When current IB starts to flow in battery pack 10 at time to, both cells start to increase in temperature. The temperature increases differently for each cell depending on the factors noted, causing temperature difference ΔT (temperature variation) to occur between both cells.

Since a cell having a higher temperature has a lower resistance than a cell having a lower temperature, increased temperature variation between the cells results in increased resistance variation between the cells. Since a relatively large current flows in a cell having a relatively low resistance, increased resistance variation between the cells results in increased current variation between the cells.

Figure 4:
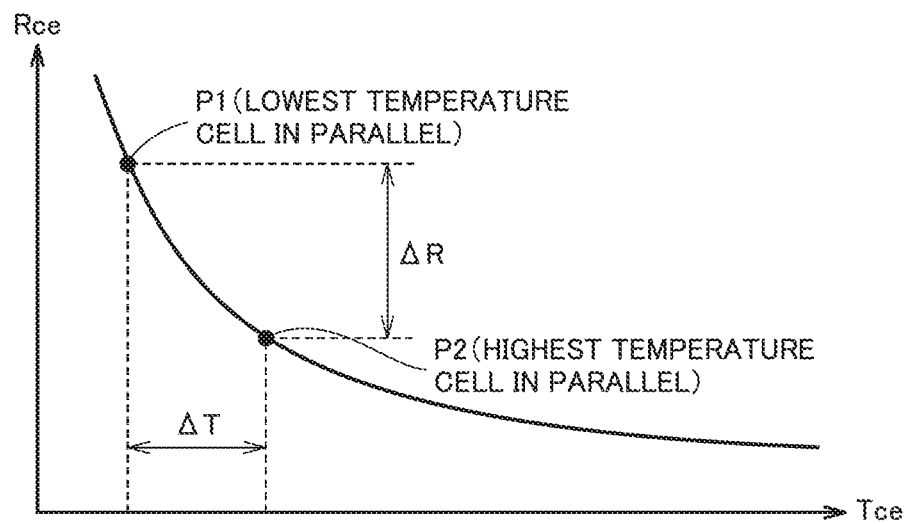
FIG. 4 shows an example of relation between temperature and resistance of a cell.

FIG. 4 shows an example of relation between temperature and resistance of a cell. Referring to FIG. 4, the horizontal axis indicates temperature Tce of a cell, and the vertical axis indicates resistance Rce of a cell. Temperature Tce and resistance Rce of a cell have such relation that resistance Rce decreases as temperature Tce increases, and the magnitude of resistance variation relative to temperature variation increases (the slope of a curve increases) as the temperature decreases.

A point P1 indicates relation between temperature and resistance of the lowest temperature cell of the plurality of cells connected in parallel, and a point P2 indicates relation between temperature and resistance of the highest temperature cell of the plurality of cells connected in parallel. Temperature difference ΔT (temperature variation) between the highest temperature cell and the lowest temperature cell causes a resistance difference ΔR (resistance variation) to occur between both cells. This resistance difference ΔR (resistance variation) in turn causes a current difference (current variation) to occur between the highest temperature cell and the lowest temperature cell.

In this manner, temperature variation between the cells results in increased current variation between the cells. As a result, even if battery protection control is performed using a total current (IB) and an average current (IB/N) flowing in the plurality of cells connected in parallel (block) without processing the currents, it may not be possible to protect a cell in which a relatively large current flows.

In battery system 2 according to this embodiment, current variation between the cells caused by temperature variation between the cells is estimated.

With regard to the temperature variation, it is practically difficult to measure the temperature variation by actually detecting the temperature for each cell. In this embodiment, therefore, the temperature of the highest temperature cell and the temperature of the lowest temperature cell are determined as described below.

Specifically, ECU 100 acquires a plurality of detection results using thermistors provided at a plurality of locations in battery pack 10. ECU 100 determines a temperature (TBmin) of the lowest temperature cell using a detection result showing the lowest temperature from the plurality of detection results acquired. ECU 100 determines a temperature, calculated by adding a temperature additional value to the determined temperature of the lowest temperature cell, as the temperature of the highest temperature cell. In this embodiment, the temperature additional value indicates a maximum value of the temperature variation between the cells in battery pack 10.

Here, assuming that the temperature additional value is a fixed value, for example, the temperature variation between the cells in battery pack 10 increases as an amount of heat generated in battery pack 10 increases, causing the temperature additional value to deviate from an appropriate value. As a result, the accuracy of estimation of the temperature of the highest temperature cell may be reduced.

In this embodiment, therefore, ECU 100 sets the temperature additional value using information related to a heat generating state of battery pack 10. In this embodiment, the information related to a heat generating state of battery pack 10 is a current. ECU 100 sets the temperature additional value to a higher value, when a root-mean-square value of the current is higher, than a value which is set when the root-mean-square value is lower. Accordingly, the temperature additional value can be set appropriately.

ECU 100 calculates, for each of the highest temperature cell and the lowest temperature cell, a temperature index (Ftmax, Ftmin) having correlation with the cell temperature in consideration of heat generation and cooling of the cell. ECU 100 sets an evaluation function (ΔF) indicating the degree of the temperature variation between the cells by subtracting the temperature index (Ftmin) of the lowest temperature cell from the temperature index (Ftmax) of the highest temperature cell.

Since the magnitude of resistance variation relative to temperature variation increases as the temperature decreases, resistance difference ΔR (resistance variation) and the resultant current difference (current variation) between the cells may increase as the temperature decreases. In battery system 2 according to this embodiment, therefore, the degree of the current variation between the cells (maximum current correction gain) is estimated using, together with the evaluation function (ΔF), the temperature of battery pack 10 (as will be described later, the lowest temperature (TBmin) of temperatures TB1 to TBj detected by temperature detection device 23 is used in this embodiment).

Figure 5:
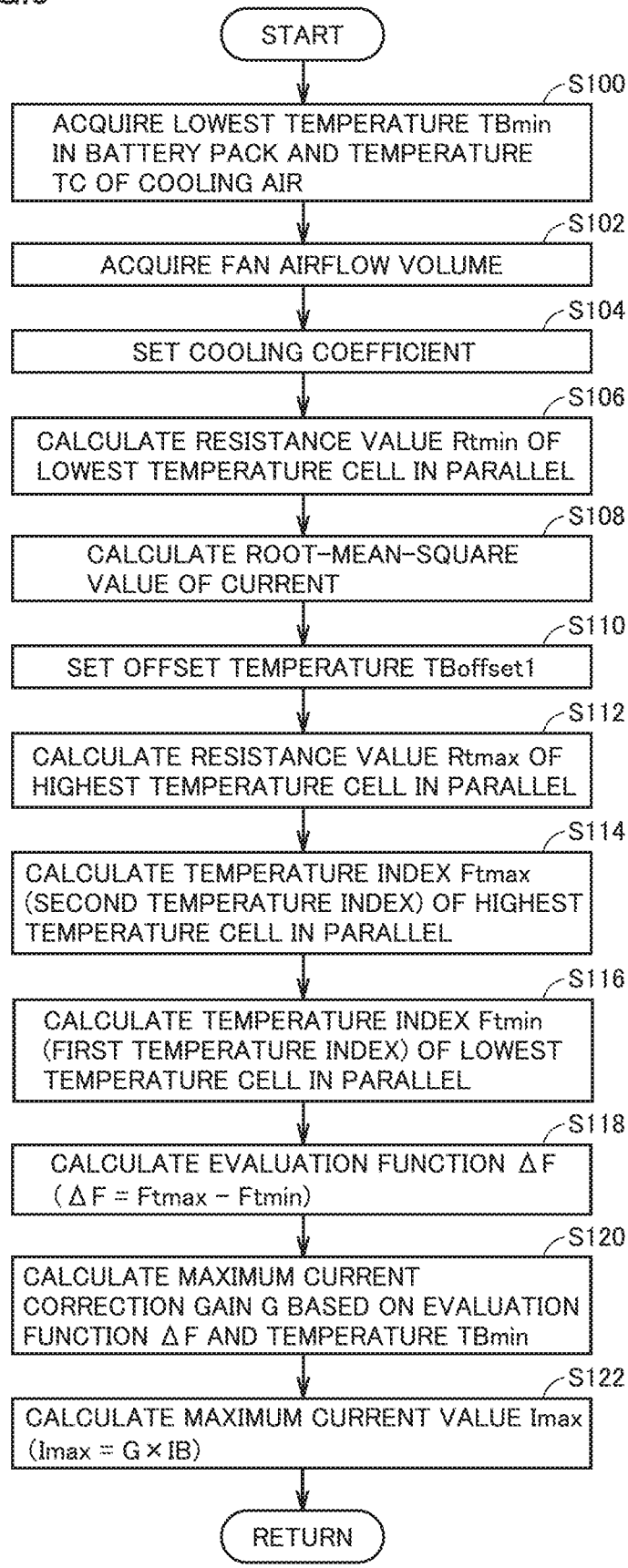
FIG. 5 is a flowchart illustrating a procedure for estimating current variation between cells.

Referring now to FIG. 5, a process of estimating the current variation between the cells is described. FIG. 5 is a flowchart illustrating a procedure for estimating the current variation between the cells. The process shown in this flowchart is repeated by ECU 100 shown in FIG. 1 in a prescribed operation cycle dt for each block forming battery pack 10.

In step (step is hereinafter referred to as S) 100, ECU 100 acquires lowest temperature TBmin in battery pack 10 and temperature TC of the cooling air. ECU 100 acquires lowest temperature TBmin from the plurality of temperatures TB1 to TBj detected using temperature detection device 23. ECU 100 acquires temperature TC of the cooling air using temperature sensor 27.

In S102, ECU 100 acquires an airflow volume of fan 26. For example, ECU 100 may acquire the airflow volume of fan 26 based on a control command value to fan 26, or may acquire the airflow volume of fan 26 based on power or a voltage supplied to fan 26, or may acquire the airflow volume of fan 26 using a rotation speed sensor provided on fan 26.

In S104, ECU 100 calculates a cooling coefficient h. ECU 100 sets cooling coefficient h using the airflow volume of fan 26, and a map (or an equation or the like) showing relation between the airflow volume and cooling coefficient h. The map showing relation between the airflow volume and cooling coefficient h is adapted by experiment and the like. The airflow volume and cooling coefficient h have such relation that cooling coefficient h increases in value as the airflow volume increases.

In S106, ECU 100 calculates a resistance value Rtmin of the lowest temperature cell of the plurality of cells connected in parallel. ECU 100 calculates Rtmin by the following equation (1), for example:

$$R\text{tmin}(t)=R\text{ivmax}\times f(T B\text{min}(t), R A H R\text{min}(t)) \tag{1}$$

Rivmax in the equation (1) represents the highest value of variation in initial resistance (product variation) present between the cells. Rivmax is determined in advance by experiment and the like. F is a coefficient indicating a reduction in resistance from the initial resistance value (Rivmax or Rivmin which will be described later), and is a function (map) having the temperature and remaining capacity (RAHR) of the cell as factors.

In the equation (1), "t" represents an operational value in the current operation cycle. TBmin is the lowest temperature of temperatures TB1 to TBj detected by temperature detection device 23. RAHRmin represents the lowest RAHR of RAHRs in each block.

In S108, ECU 100 calculates a root-mean-square value IBa of the current. ECU 100 calculates the root-mean-square value of the current using, as shown in the following equation (2), for example, the current value of the current detected by current detection device 22, and a predetermined number of detection results detected in an immediately preceding predetermined period. ECU 100 may calculate the current value by adding a value, obtained by multiplying the difference between the previous value and the current root-mean-square value by a prescribed constant (smoothing constant) k, to the previous value, as shown in the following equation (3), for example, instead of the equation (2):

$$IBa(t)=\sqrt{IB(t)^2+IB(t-1)^2+\ldots+IB(t-n)^2} \tag{2}$$

$$IBa(t)=IBa(t-1)+k\times(\sqrt{IB(t)^2+IB(t-1)^2+\ldots+IB(t-n)^2}-IBa(t-1)) \tag{3}$$

In S110, ECU 100 sets an offset temperature TBoffset1. Offset temperature TBoffset1 is an offset temperature for calculating the temperature of the highest temperature cell using the temperature of the lowest temperature cell, and indicates temperature variation between the plurality of cells connected in parallel. ECU 100 sets offset temperature TBoffset1 using, for example, the current value of the root-mean-square value, and a map (or an equation or the like) showing relation between the root-mean-square value and offset temperature TBoffset1. The map showing relation between the root-mean-square value and offset temperature TBoffset1 is adapted by experiment and the like. The root-mean-square value and offset temperature TBoffset1 have such relation that, for example, the amount of heat generated in the battery pack increases as the root-mean-square value increases, causing the temperature variation to increase, and thus causing offset temperature TBoffset1 to increase in value.

In S112, ECU 100 calculates a resistance value Rtmax of the highest temperature cell of the plurality of cells connected in parallel. ECU 100 calculates Rtmax by the following equation (4), for example:

$$R\text{tmax}(t)=R\text{ivmin}\times f(T B\text{min}(t)+T B\text{offset1}, R A H R\text{min}(t)+R A H R\text{offset}) \tag{4}$$

Rivmin in the equation (4) represents the lowest value of variation in initial resistance (product variation) present between the cells. Since the highest temperature cell has a higher cell temperature and a lower resistance than the lowest temperature cell, Rivmin is used for the calculation of resistance Rtmax of the highest temperature cell, and Rivmax is used for the calculation of resistance Rtmin of the lowest temperature cell. Rivmin is determined in advance by experiment and the like.

As described above, f is a coefficient indicating a reduction in resistance from the initial resistance value (Rivmin or Rivmax), and is a function (map) having the temperature and the remaining capacity (RAHR) of the cell as factors. In the equation (4), the temperature of the highest temperature cell, that is, a value obtained by adding offset temperature TBoffset1 to the temperature (TBmin) of the lowest temperature cell is used as a factor of the temperature of the cell. An offset amount RAHRoffset is a prescribed value for calculating RAHRmax indicating the highest RAHR of RAHRs in each block using RAHRmin.

Here, FIG. 6 is a map for determining coefficient f used in the equation (1) and the equation (4). Referring to FIG. 6, coefficient f is determined based on the temperature and the remaining capacity (RAHR) of the cell. Basically, coefficient f increases in value as the temperature and RAHR decrease, and coefficient f decreases in value as the temperature and RAHR increase. The specific values in the map are determined in advance by experiment and the like.

Figure 7:
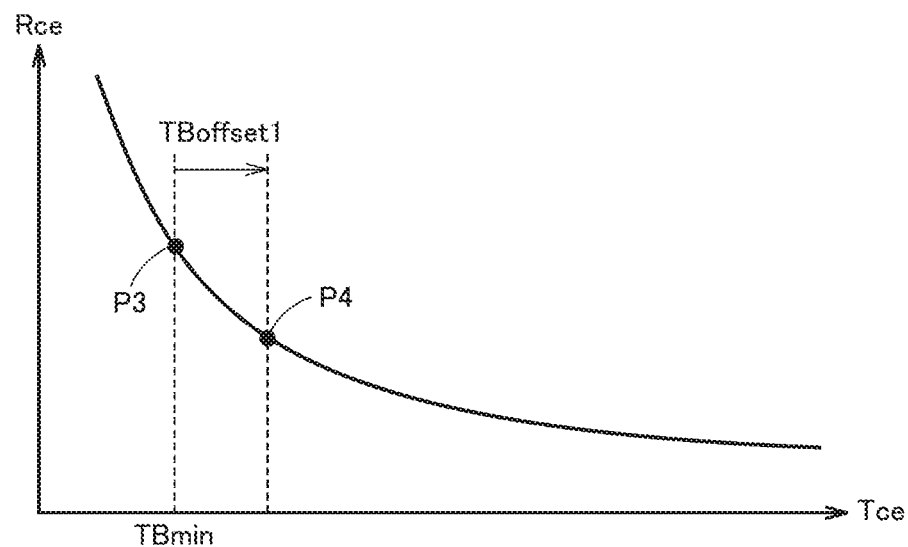
FIG. 7 shows dependence of resistance of a cell on temperature.

FIG. 7 shows dependence of resistance of a cell on temperature. Referring to FIG. 7, the horizontal axis indicates temperature Tce of a cell, and the vertical axis indicates resistance Rce of a cell. Temperature Tce and resistance Rce have such relation that resistance Rce increases as temperature Tce decreases, and resistance Rce decreases as temperature Tce increases.

A point P3 indicates relation between temperature Tce and resistance Rce of the lowest temperature cell of the plurality of cells connected in parallel. In this embodiment, as shown in the equation (1), resistance Rtmin of the lowest temperature cell is estimated using TBmin showing the lowest temperature in battery pack 10.

A point P4 indicates relation between temperature Tce and resistance Rce of the highest temperature cell of the plurality of cells connected in parallel. In this embodiment, as shown in the equation (4), Rtmax of the highest temperature cell is estimated using the value, obtained by adding temperature offset amount TBoffset1 to TBmin showing the lowest temperature in battery pack 10, as the temperature of the highest temperature cell.

Figure 8:
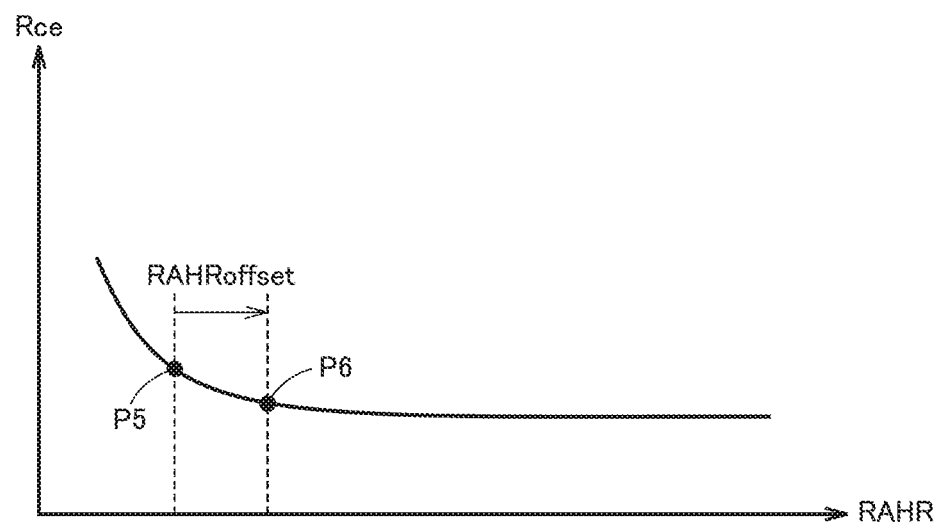
FIG. 8 shows dependence of resistance of a cell on remaining capacity.

FIG. 8 shows dependence of resistance of a cell on remaining capacity. Referring to FIG. 8, the horizontal axis indicates the remaining capacity (RAHR (%)) on a block-by-block basis, and the vertical axis indicates resistance Rce of a cell. RAHR and resistance Rce have such relation that resistance Rce increases as RAHR decreases.

A point P5 indicates relation between resistance Rce and RAHR of the lowest temperature cell of the plurality of cells connected in parallel. As can be understood from the figure, the sensitivity of variation in RAHR relative to variation in resistance is higher in a region where RAHR is lower. In this embodiment, therefore, as shown in the equation (1), resistance Rtmin of the lowest temperature cell is estimated using RAHRmin indicating the lowest RAHR of RAHRs in each block.

A point P6 indicates relation between resistance Rce and RAHR of the highest temperature cell of the plurality of cells connected in parallel. In this embodiment, as shown in the equation (4), resistance Rtmax of the highest temperature cell is estimated using the value, obtained by adding prescribed offset amount RAHRoffset to RAHRmin, as RAHR of the highest temperature cell.

In S114, ECU 100 calculates temperature index Ftmax (second temperature index) of the highest temperature cell of the plurality of cells connected in parallel by the following equations:

$$Ftmax(t) = Ftmax(t-1) + Fk \times (Qtmax(t) - Ctmax(t)) \quad (5)$$

$$Qtmax(t) = Qtmax(t-1) + Qktmax \times (Rtmax(t) \times Itmax(t)^2 \times dt - Qtmax(t-1)) \quad (6)$$

$$Ctmax(t) = Ctmax(t-1) + Cktmax \times (h(t) \times (TBmin(t) + TBoffset2 - TC(t)) \times dt - Ctmax(t-1)) \quad (7)$$

In each equation, Qtmax represents an amount of heat generated by the highest temperature cell (heat generation term associated with energization), and Ctmax represents a cooled amount of the highest temperature cell (cooling term by cooling device 24). Fk is a prescribed correction coefficient. In an equation (6), Itmax represents a current in the highest temperature cell, and Qktmax is a prescribed constant (smoothing constant). Itmax is calculated by an equation (11) described later.

In an equation (7), TBoffset2 is an offset value for causing this cooling term of the highest temperature cell to be calculated as a greater value than a cooling term of the lowest temperature cell which will be described later. TC is the temperature of the cooling air detected by temperature sensor 27 (FIG. 1) as described above. H (t) is the aforementioned cooling coefficient.

ECU 100 calculates Rtmax and Itmax, and calculates amount of generated heat Qtmax by the highest temperature cell by the equation (6) using calculated Rtmax and Itmax. Then, ECU 100 calculates, using calculated amount of generated heat Qtmax and cooled amount Ctmax calculated by the equation (7), temperature index Ftmax (second temperature index) of the highest temperature cell by an equation (5).

In S116, ECU 100 calculates temperature index Ftmin (first temperature index) of the lowest temperature cell of the plurality of cells connected in parallel by the following equations:

$$Ftmin(t) = Ftmin(t-1) + Fk \times (Qtmin(t) - Ctmin(t)) \quad (8)$$

$$Qtmin(t) = Qtmin(t-1) + Qktmin \times (Rtmin(t) \times Itmin(t)^2 \times dt - Qtmin(t-1)) \quad (9)$$

$$Ctmin(t) = Ctmin(t-1) + Cktmin \times (h(t) \times (TBmin(t) - TC(t)) \times dt - Ctmin(t-1)) \quad (10)$$

Qtmin represents an amount of heat generated by the lowest temperature cell (heat generation term associated with energization), and Ctmin represents a cooled amount of the lowest temperature cell (cooling term by the cooling device). In an equation (9), Itmin represents a current in the lowest temperature cell, and Qktmin is a prescribed constant (smoothing constant). Itmin is calculated by an equation (12) described later.

ECU 100 calculates Rtmin and Itmin, and calculates amount of generated heat Qtmin by the lowest temperature cell by the equation (9) using calculated Rtmin and Itmin. Then, ECU 100 calculates, using calculated amount of generated heat Qtmin and cooled amount Ctmin calculated by an equation (10), temperature index Ftmin (first temperature index) of the lowest temperature cell by an equation (8).

Rtmax (resistance of the highest temperature cell) in the above equation (6) is calculated by the equation (4). Rtmin (resistance of the lowest temperature cell) in the above equation (9) is calculated by the equation (1).

Figure 9:
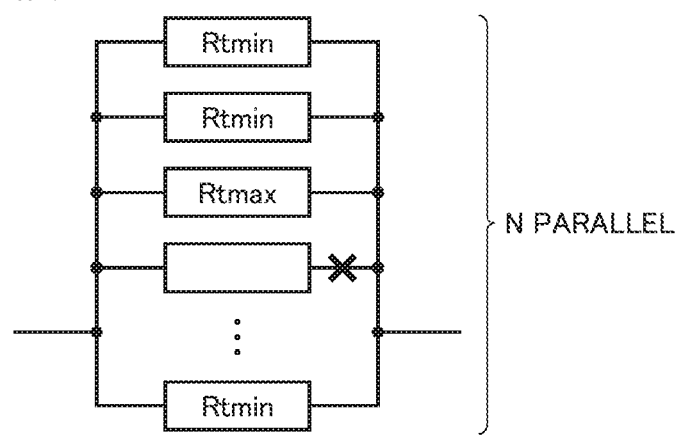
FIG. 9 shows a plurality of cells connected in parallel.

Itmax (current in the highest temperature cell) in the above equation (6) and Itmin (current in the lowest temperature cell) in the above equation (9) are estimated by the following equations assuming that, as shown in FIG. 9, each of the plurality of cells connected in parallel is either the highest temperature cell or the lowest temperature cell, and in consideration of a disconnection of one of the cells (a disconnection may cause a current increase in another cell, resulting in increased current variation):

$$Itmax(t) = \frac{\dfrac{Rtmin}{N-N1-N2}}{\dfrac{Rtmax}{N1} + \dfrac{Rtmin}{N-N1-N2}} \times \frac{I(t)}{N1} \quad (11)$$

$$Itmin(t) = \frac{\dfrac{Rtmax}{N1}}{\dfrac{Rtmax}{N1} + \dfrac{Rtmin}{N-N1-N2}} \times \frac{I(t)}{N-N1-N2} \quad (12)$$

N is the number of parallel cells in each block (FIG. 2). N1 is the number of highest temperature cells in the N cells connected in parallel, and N2 is the number of disconnected cells. These equations (11) and (12) can be readily derived using Rtmax (resistance of the highest temperature cell) and Rtmin (resistance of the lowest temperature cell) calculated in the above equations (4) and (1), and the model shown in FIG. 9.

In this embodiment, a condition where the current variation is greatest when battery pack 10 can be used corresponds to N1=1 (the degree of current concentration in the highest temperature cell is highest), and a worst value when battery pack 10 can be used is set to N2 (for example, N2=2 for N=15).

Turning back to FIG. 5, in S118, ECU 100 calculates evaluation function ΔF indicating the degree of the temperature variation between the cells, by subtracting temperature index Ftmin of the lowest temperature cell from temperature index Ftmax of the highest temperature cell, as shown in the following equation (13):

$$\Delta F(t) = Ftmax(t) - Ftmin(t) \quad (13)$$

In S120, ECU 100 calculates, using calculated evaluation function ΔF and temperature TBmin showing the lowest temperature in battery pack 10, maximum current correction gain G indicating the degree of the current variation between the cells.

Figures 10, 11:
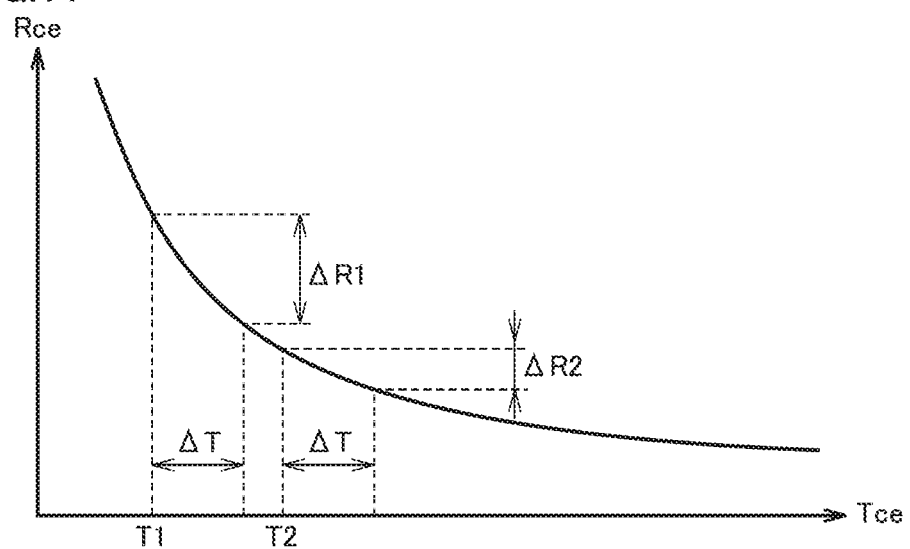
FIG. 10 is a map of maximum current correction gain G.
FIG. 11 shows relation between temperature and resistance of a cell.

FIG. 10 shows a map of maximum current correction gain G. Referring to FIG. 10, maximum current correction gain G is determined by evaluation function ΔF indicating the degree of the temperature variation between the cells, and temperature TBmin. This maximum current correction gain G shows that the current variation increases as the value of maximum current correction gain G increases. Generally, maximum current correction gain G increases in value as evaluation function ΔF increases in value (as the temperature variation increases), and as temperature TBmin decreases.

Temperature TBmin showing the lowest temperature in battery pack 10 is used because the current variation between the cells may increase as the temperature decreases.

FIG. 11 shows relation between temperature and resistance of a cell. Referring to FIG. 11, the horizontal axis indicates temperature Tce of a cell, and the vertical axis indicates resistance Rce of a cell. As shown in FIG. 11, even with the same temperature difference $\Delta T$ between the cells (evaluation function $\Delta F$), resistance difference $\Delta R$ (resistance variation) between the cells increases as the cell temperature decreases, which causes the current variation between the cells to increase as well. In this embodiment, therefore, as shown in the map of FIG. 10, maximum current correction gain G is calculated in consideration not only of evaluation function $\Delta F$ indicating the degree of the temperature variation between the cells, but also of the temperature of battery pack 10. Moreover, in this embodiment, temperature TBmin showing the lowest temperature in battery pack 10 is used as the most stringent temperature condition.

Turning back to FIG. 5, in S122, ECU 100 calculates a maximum current value Imax by multiplying current IB in battery pack 10 detected by current detection device 22 by maximum current correction gain G. Then, although not particularly depicted, ECU 100 performs various types of limiting control based on this maximum current value Imax, such as limiting current IB so as to prevent maximum current value Imax from exceeding the upper limit, or limiting input/output of battery pack 10 so as to prevent electric power calculated based on maximum current value Imax from exceeding the upper limit.

The operation of battery system 2 according to the present embodiment based on the structure and the flowchart as described above is described.

In a situation where electric power is supplied from battery pack 10 to MG 42 during travel of vehicle 1, for example, lowest temperature TBmin in battery pack 10 and cooling air temperature TC are acquired (S100). Then, the fan airflow volume is acquired (S102), and cooling coefficient h is set based on the acquired fan airflow volume (S104).

Once cooling coefficient h is determined, resistance value Rtmin of the lowest temperature cell is calculated (S106), root-mean-square value IBa of the current is calculated (S108), and offset temperature TBoffset1 is calculated in accordance with calculated root-mean-square value IBa (S110).

Then, the temperature calculated by adding offset temperature TBoffset1 to the temperature of the lowest temperature cell is set as the temperature of the highest temperature cell, to calculate resistance value Rtmax of the highest temperature cell (S112).

Temperature index Ftmax and temperature index Ftmin are calculated using calculated Rtmax and Rtmin (S114, S116), and evaluation function $\Delta F$ is calculated (S118).

Maximum current correction gain G is calculated based on calculated evaluation function $\Delta F$, temperature TBmin, and the map shown in FIG. 10, and calculated maximum current correction gain G and current IB are multiplied together, to calculate maximum current value Itmax (S122).

As described above, according to battery system 2 of the present embodiment, evaluation function $\Delta F$ indicating the degree of the temperature variation between the cells is calculated, and the degree of the current variation between the cells is estimated using that evaluation function $\Delta F$ and temperature TBmin of battery pack 10 (calculation of maximum current correction gain G). Accordingly, appropriate battery protection control can be implemented using maximum current value Imax obtained by multiplying actual current IB by this maximum current correction gain G. In particular, the second temperature index is calculated using an offset temperature offset1 which is set based on root-mean-square value IBa of the current, thereby allowing evaluation function (evaluation value) $\Delta F$ to be calculated with a high degree of accuracy. As a result, the current variation between the plurality of secondary batteries connected in parallel caused by the temperature variation between the plurality of secondary batteries can be estimated with a high degree of accuracy. Accordingly, appropriate battery protection control can be implemented on the plurality of secondary batteries. Therefore, a battery system capable of implementing appropriate battery protection control in consideration of current variation caused by temperature variation between a plurality of secondary batteries connected in parallel can be provided.

Moreover, offset temperature offset1 is set based on the root-mean-square value of the current, thereby allowing offset temperature offset1 to be set appropriately in accordance with a heat generating state of the battery pack.

A modification is described below.

Although battery system 2 has been described as being mounted on a hybrid vehicle as an example in the above embodiment, battery system 2 may be mounted on various types of vehicles other than the hybrid vehicle as described above, or on a movable body other than a vehicle.

Moreover, although the current variation has been described as being calculated between the lowest temperature cell and the highest temperature cell in the above embodiment, current variation may be calculated between a first cell having a relatively low temperature of the plurality of cells and a second cell having a temperature higher than that of the first cell by a prescribed temperature, for example, to perform appropriate battery protection control in consideration of the calculated current variation. For example, current variation may be calculated between a first cell having the n-th lowest temperature of the plurality of cells and a second cell having the n-th highest temperature of the plurality of cells, to perform appropriate battery protection control in consideration of the calculated current variation.

Moreover, although offset temperature offset1 has been described as being set based on the root-mean-square value of the current in the above embodiment, offset temperature offset1 is only required to be set using the information related to a heat generating state of the battery pack. For example, offset temperature offset1 may be set based on the internal resistance of battery pack 10, or offset temperature offset1 may be set based on the internal resistance and the voltage of the battery pack. For example, as the internal resistance and the voltage of battery pack 10 increase, the amount of generated heat increases to cause increased temperature variation, and therefore, offset temperature offset1 may be increased in value.

The above modification may be entirely or partially combined as appropriate for implementation.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A battery system comprising:
   a battery pack formed of a plurality of secondary batteries connected in parallel;
   a cooling device configured to supply a cooling medium to the battery pack; and a controller configured to estimate current variation between the plurality of secondary batteries caused by temperature variation between the plurality of secondary batteries, the plurality of secondary batteries including a first battery and a second battery, the controller being configured to calculate a first temperature index having correlation with a temperature of the first battery, using an amount of heat generated by the first battery, the first battery having a relatively low temperature of the plurality of secondary batteries, and a cooled amount of the first battery by the cooling device, set a temperature additional value using information related to a heat generating state of the battery pack, calculate a second temperature index having correlation with a temperature of the second battery, using an amount of heat generated by the second battery, the second battery having a temperature calculated by adding the temperature additional value to the temperature of the first battery, and a cooled amount of the second battery by the cooling device, calculate an evaluation value indicating a degree of the temperature variation by subtracting the first temperature index from the second temperature index, and estimate a degree of the current variation using the calculated evaluation value and a temperature of the battery pack.

2. The battery system according to claim 1, wherein the information related to a heat generating state of the battery pack is information about a current in the battery pack, and the controller is configured to set the temperature additional value to a higher value, when a root-mean-square value of the current is higher, than a value which is set when the root-mean-square value is lower.

3. The battery system according to claim 1, wherein the first battery has the lowest temperature of the plurality of secondary batteries, the second battery has the highest temperature of the plurality of secondary batteries, the battery system further comprises a detection device configured to detect the temperature of the first battery, and the controller is configured to acquire the temperature of the first battery using the detection device, and to calculate the temperature of the second battery by adding the temperature additional value to the temperature of the first battery.

* * * * *